United States Patent [19]

Goto et al.

[11] Patent Number: 5,151,617
[45] Date of Patent: Sep. 29, 1992

[54] SUPERCONDUCTING LOGIC CIRCUIT

[75] Inventors: Eiichi Goto, Fujisawa; Willy Hioe, Kodaira; Mutsumi Hosoya, Kokubunji; Ryotaro Kamikawai, Tokyo, all of Japan

[73] Assignees: Research Development Corporation of Japan; Ryotaro Kamikawai, both of Tokyo, Japan

[21] Appl. No.: 665,085

[22] Filed: Mar. 6, 1991

[30] Foreign Application Priority Data

Mar. 13, 1990 [JP] Japan .................. 61880

[51] Int. Cl.$^5$ .................. H03K 19/23; H03K 19/195
[52] U.S. Cl. .................. 307/462; 307/464; 307/476; 505/859
[58] Field of Search .............. 307/476, 245, 462, 464, 307/306; 505/865, 866

[56] References Cited

U.S. PATENT DOCUMENTS 4,117,354  9/1978  Geewala ............... 307/462
4,902,908  2/1990  Harada ................. 307/476
4,916,335  4/1990  Goto et al. ........... 307/462
5,051,627  9/1991  Schneier et al. ...... 307/476

OTHER PUBLICATIONS

K. F. Loe & E. Goto, "IEEE Transactions on Magnetics", vol. Mag-21, No. 2, March 1985, pp. 884-887.

Primary Examiner—Edward P. Westin
Assistant Examiner—Richard Roseen
Attorney, Agent, or Firm—Fleit, Jacobson, Cohn, Price, Holman & Stern

[57] ABSTRACT

A superconducting logic circuit is configured by using two kinds of input-output type quantum flux parametrons (QFP), that is, a periodically excited input-output type QFP and an arbitrarily excited input-output type QFP. The periodically excited QFP is excited by periodically varying exciting magnetic flux to amplify a binary magnetic flux. The arbitrarily excited QFP is excited by magnetic flux output signals of upstream QFPs.

4 Claims, 5 Drawing Sheets

SUPERCONDUCTING LOGIC CIRCUIT

FIELD OF THE INVENTION

This invention relates to superconducting circuits which operate very low temperatures and particularly relates to parametron-type superconducting logic circuits.

DESCRIPTION OF THE PRIOR ART

The quantum flux parametron(hereinafter "QFP") is a parametron-type superconducting circuit which uses Josephson junctions (the term "Josephson junction" is used in the broadest sense so that various kinds of devices exhibiting the Josephson effects are included.). In the QFP, a direct current magnetic flux quantum is used as a signal medium and the operation is based on the parametron concept The QFP is very adequate for computer elements because it operates at a very high speed and consumes less power The QFP also has very good qualities for analog circuits such as magnetic flux sensors because the QFP can amplify very weak magnetic flux with a high gain.

FIG. 4 shows a basic circuit configuration of the QFP. The circuit comprises a superconducting loop 5 made by connecting a pair of circuits which comprise a first exciting inductor 1 and a first Josephson junction 2, and a second exciting inductor 3 and a second Josephson junction 4, respectively. The superconducting loop 5 is directly connected with an input line 7 and a load inductor 8. An exciting line 6 is provided, which is magnetically coupled with the first and the second exciting inductors 1 and 3. In the excited state when an exciting magnetic flux is supplied to the exciting line 6, the output magnetic flux supplied to the load inductor 8 from the QFP can have only two opposite polarities of the same absolute value In the QFP, the polarities(directions) of the magnetic flux output signals correspond to "1" and "0" of the digital signals. Hereinafter, basic operation of the QFP will be described. Firstly, before supplying an exciting magnetic flux, a very small input magnetic flux is injected into the superconducting loop 5 and the load inductor 8 via the input line 7. In this condition, if the exciting magnetic flux is supplied to the exciting line 6, then an output magnetic flux of the same polarity as that of the input magnetic flux is supplied by the QFP to the load inductor 8, such that an amplified magnetic flux output is obtained.

In logic circuits using the QFPs, logic operation of the circuit may be carried out according to majority logic. FIG. 5 shows a basic QFP majority logic gate which now will be explained. QFPs 100a, 100b and 100c are excited by exciting signals of the same phase. The respective QFPs are supplied with binary logic signals x1, x2 and x3 and then excited by the exciting signals. In this condition, amplified magnetic flux output signals are supplied to a next stage QFP 100d through the output lines. The amplified magnetic flux output signals have the same amplitude, but the polarities of the output signals are positive or negative depending on the polarities of the input signals. The polarity of the amplified flux, which will be introduced into the QFP 100d, is the same as the majority of the directions of the input signals x1, x2 and x3. If a binary logic variable y is defined as the input signal for the QFP 100d, y can be represented by a majority function of x1, x2 and x3, that is, y=x1 x2+x2 x3+x3 x1. After the amplitude of the input signal for the QFP 100d becomes stable, an exciting signal is supplied to the QFP 100d to amplify the input signal. The amplified signal from the QFP 100d is fed to a next stage QFP. In the logic gate using the QFPs, as described above, the exciting signal for the QFP 100d is delayed with respect to the exciting signals for the QFPs 100a, 100b and 100c. In general, in order to send a logic signal from one stage to the subsequent stage in a QFP logic circuit, supply of an exciting signal to the QFPs in the subsequent stage is delayed as compared with supply of an exciting signal to the QFPs in the present stage. Since periodically varying signals are used as the exciting signals, the phase of exciting signals to the QFPs in the subsequent stage is delayed compared with those in the present stage.

In the majority logic gate as described above, the operation may result in error if the outputs of the QFPs in the previous stage do not have the same absolute value because of variations of exciting signals and variations of fabrication conditions. The correct operation of the gate is weak against variations of the output flux of the QFPs in the previous stage. In the three-input majority gate, the permissible variations of output flux of the QFPs in the upstream stage is only ±33% at maximum. For example, in the case that two of the three inputs are magnetic flux of the same polarity and the other has the opposite polarity, when the absolute values of the two inputs of the majority polarity decrease by 34% from a typical value and the absolute value of the other input of the majority polarity increases by 33% from the typical value, the input flux of the QFP 100d has the majority polarity and a wrong output signal is produced. As may be seen from the above descriptions, the larger the number of inputs, the worse the stability of the majority logic operation is. Therefore, the design margin becomes narrow..This problem results because the QFP majority logic gate operates depending on not only the directions of the input signals but also the absolute values thereof.

The prior art QFP as shown in FIG. 4 has noise problem because the currents of the logic signals are normally designed to be less than half of the characteristic current(critical current) of the Josephson junctions and the currents of exciting signals are at least ten times larger than the characteristic current of the Josephson junctions and thus the currents of the exciting signals are much greater than that of the logic signals. Further, since the maximum output signal current of QFP is only twice the characteristic current of the Josephson junction, it is difficult to excite a QFP by other QFPs. Thus, the prior art QFP can not be used as a switch. Lastly, since only single level logic operations can be realized in each phase, it is needed to supply many exciting signals in very short periods.

SUMMARY OF THE INVENTION

An object of this invention is to solve the above described problems and to provide a new QFP logic circuit.

In order to attain the object, this invention newly provides an input-output type QFP. This invention also provides a new logic gate using two kinds of the input-output type QFPs, that is, a periodically excited QFP and an arbitrarily excited QFP. The periodically excited QFP is excited by a periodically varying magnetic flux which is externally supplied and to be called a clock signal. The periodically excited QFP is used to amplify the binary magnetic flux signal. The arbitrarily excited QFP is excited by output signals of the periodically excited QFPs and used to do the binary logic operations.

According to this invention, the binary logic operations can be carried out not depending on the absolute values but on the polarities of the signals representing the binary logic values, so that the limitation of the amplitude margin required for the input signals is relaxed. Further, the periodically excited QFP is excited by the clock signal to produce an output signal which excites and controls another QFP. Therefore, two logic stages can be realized by one phase.

DETAILED DESCRIPTION OF PREFERRED EMBODIMENTS

Figure 1:
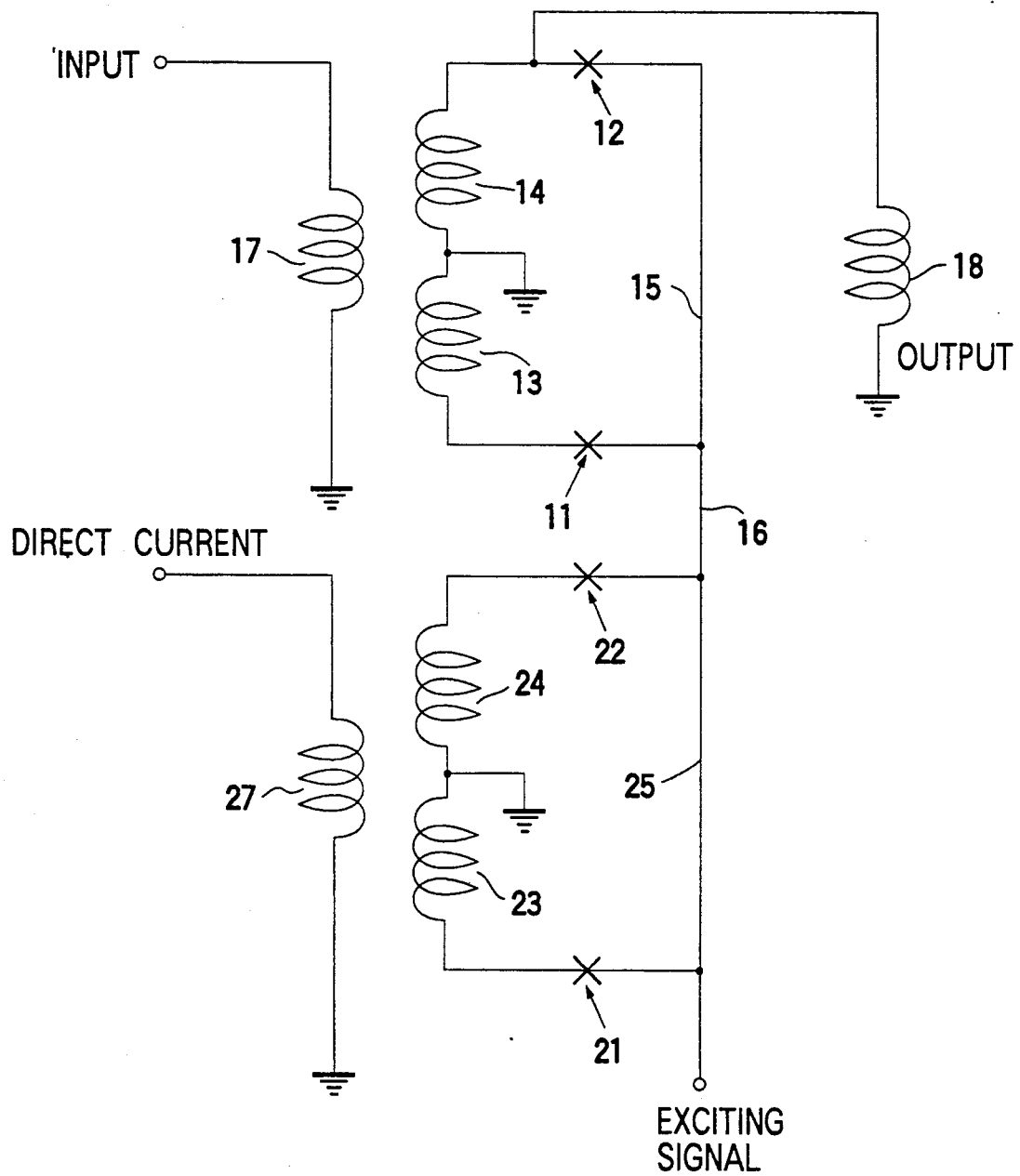
FIG. 1 shows an example of an input-output type QFP according to this invention.
Figure 4:
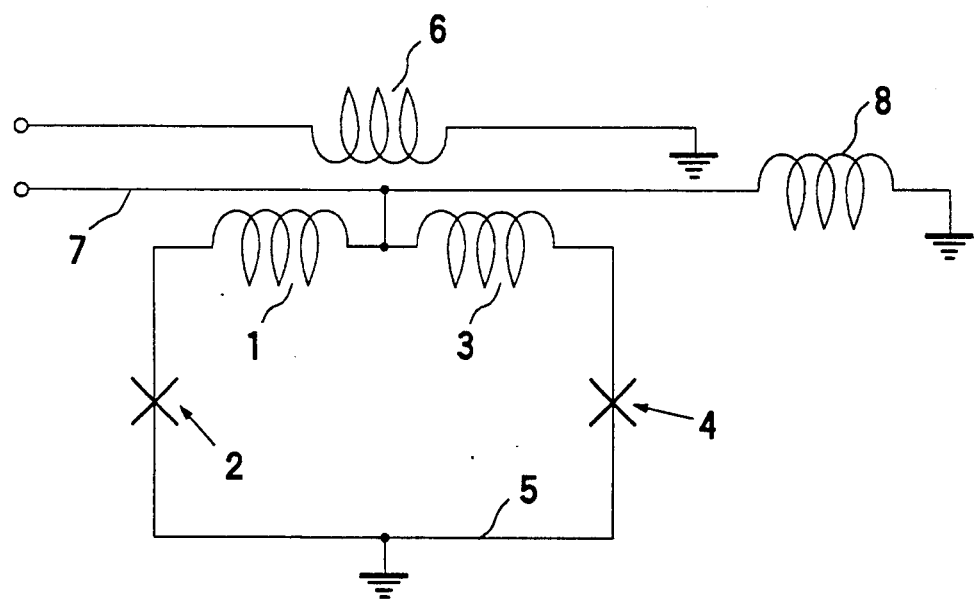
FIG. 4 shows a circuit diagram of the prior art QFP.
Figure 5:
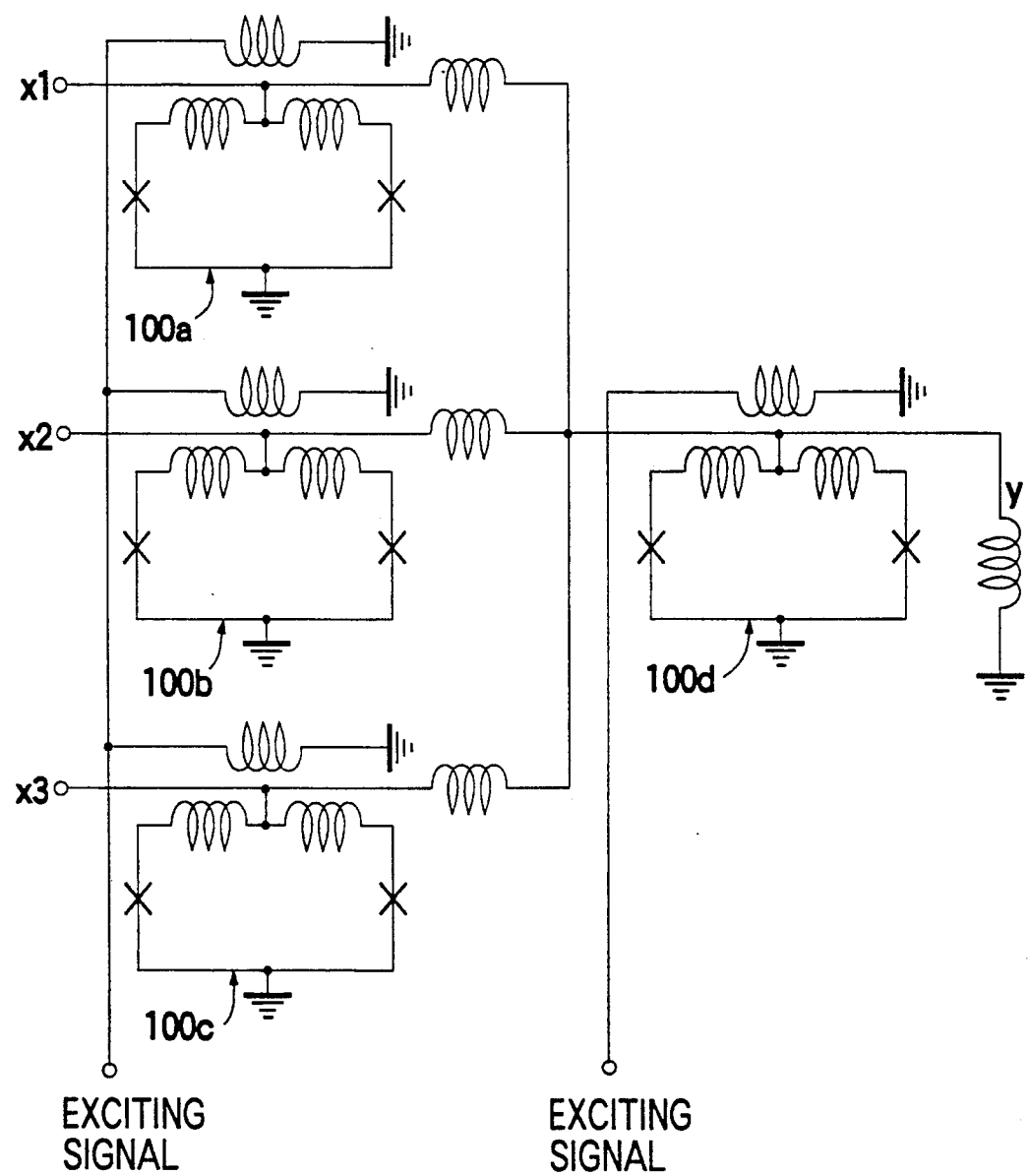
FIG. 5 shows a circuit diagram of a majority logic circuit using the prior art QFPs.

FIG. 1 shows a basic circuit of the input-output type QFP. This QFP comprises a superconductor loop 15 which is made by connecting a pair of circuits which have a first Josephson junction 11 and a first input inductor 13, and a second Josephson junction 12 and a second input inductor 14, respectively. The superconductor loop 15 is directly connected with an exciting line 16 and an output inductor 18. Around the superconductor loop 15 provided is an input line 17 which is magnetically connected to the first and second input inductors 13 and 14. The inductances of the first and the second inductors 13 and 14 are set as the same value and this value is determined so that magnetic flux of $\Phi_0/2$ is generated at the respective inductors when currents having the same value as the characteristic currents of the Josephson junction flow through the inductors, wherein $\phi_0$ is the magnetic flux quantum. A booster is connected to the exciting line 16. The booster comprises a superconductor loop 25 which is made by connecting a pair of circuits which have a third Josephson junction 21 and a third input inductor 23, and a fourth Josephson junction 22 and a fourth input inductor 24, respectively. Around the superconductor loop 25 provided is a direct current exciting input line 27 which is magnetically connnected to the third and the fourth input inductors 23 and 24. Hereinafter, we will briefly explain the operation of the input-output QFP as constructed above by use of magnetic flux. Firstly, by passing a direct current through the direct current exciting line 27, the third and fourth input inductors are supplied with the magnetic flux of $\phi_0/2$, respectively. When a small exciting magnetic flux is supplied to the superconductor loop 25 through the small circle shown at the lower portion of FIG. 1, the superconductor loop 25 acts as the QFP of the configuration of FIG. 4 using the loop 15 as the load inductor, and an amplified exciting magnetic flux ($\phi_9$) is supplied to the superconductor loop 15 through the exciting line 16. In turn, the superconductor loop 15 acts as the QFP using the loop 25 as the load inductor. An amplified output magnetic flux having the same polarity of the input magnetic flux is produced at the output inductor 18. At the beginning of excitation, a large current flows through the exciting line 16 due to a magnetic flux quantum trapped in this QFP, but after completion of the excitation the large current flowing is stopped by outgoing of the magnetic flux quantum or incoming of a cancel magnetic flux quantum. Hence excitation can be easily brought about by an output signal of the QFP used as the exciting signal. Although the intensity of the direct current exciting input is as large as that of the exciting current of the prior art QFP, the noise problem does not occur because it is a direct current.

The periodically excited QFP is an input-output type QFP which is excited by a signal which changes periodically. Hereinafter we will explain the arbitrarily excited QFP.

Figure 2:
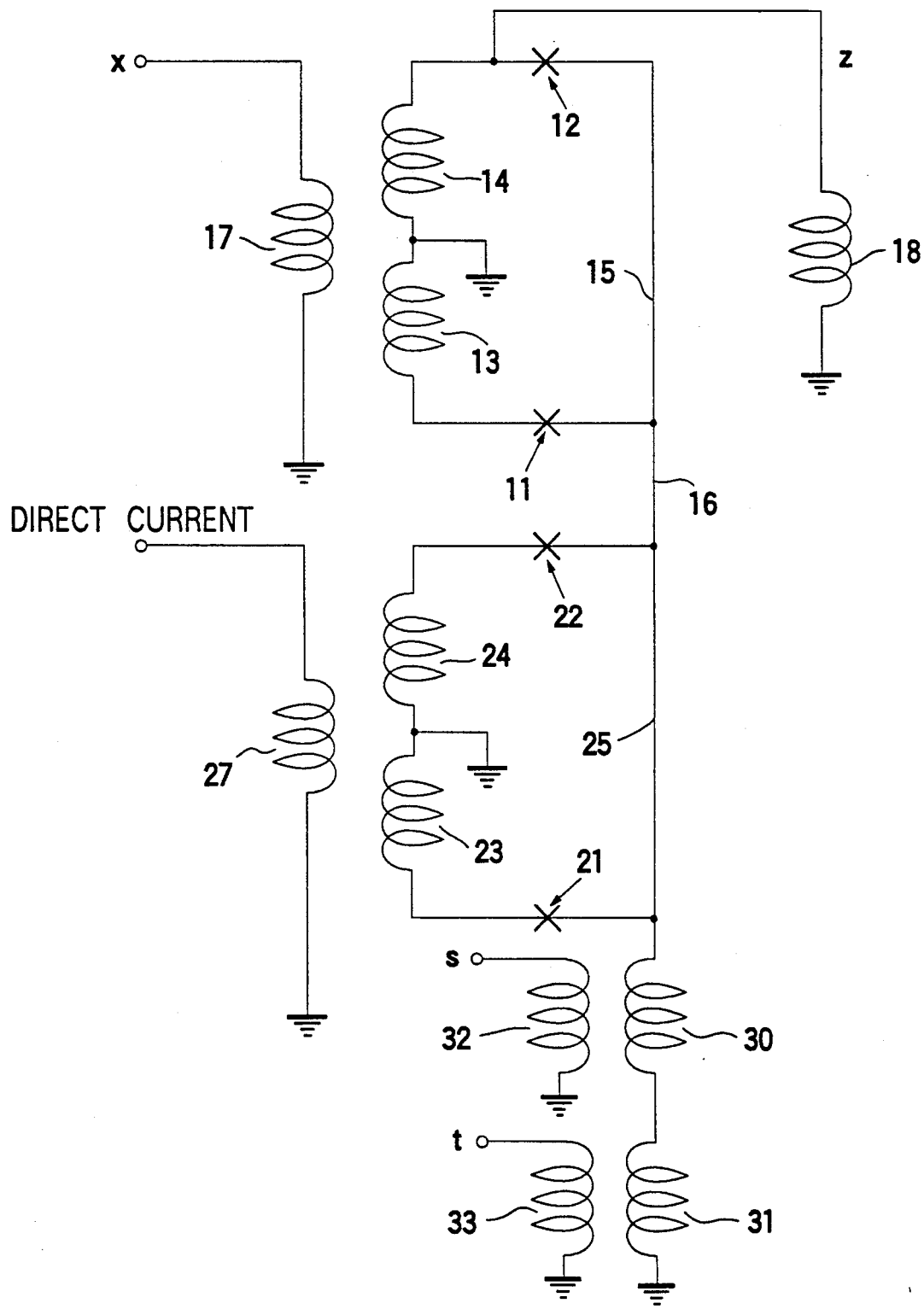
FIG. 2 shows an example of an arbitrarily excited QFP.

As shown in FIG. 2, circuit configuration of the arbitrarily excited QFP is the same as that of the input-output type periodically excited QFP besides the exciting portion. The exciting line 16 is connected in series with two exciting input inductors 30 and 31. Around the exciting input inductors 30 and 31 exciting input lines 32 and 33 are respectively provided and magnetically connected to the corresponding exciting input inductors. Due to the directions of the magnetic couplings, a sum or a difference of the exciting magnetic flux inputs is supplied to the arbitrarily excited QFP. In the case of sum, if the input signal supplied to the input line 17 is x, the exciting input signals are s and t, and the output signal is z, then z is represented by the three inputs x, s and t, that is, a logic function $z = x\,s\,t + x\,s'\,t'$, where s' and t' are the inverse signals of s and t, and the directions of the magnetic couplings between two exciting input lines and the exciting input inductors are assumed to be the same direction. When s and t have the same polarity, that is, the same logic value, an exciting magnetic flux is supplied to the arbitrarily excited QFP and the input signal x is amplified and outputted. On the other hand, when s and t are not the same logic value they are cancelled, the exciting magnetic flux becomes 0 and the arbitrarily excited QFP is not excited. Thus, the output magnetic flux of the arbitrarily excited QFP is almost 0.

In the case that a difference of the exciting magnetic flux inputs is used as the exciting signal, the output signal z is represented by the three inputs, that is, a logic function $z = x\,s'\,t + x\,s\,t'$, thus the arbitrarily excited QFP is not excited when s and t are the same value, it is excited when s and t are not the same value. Therefore, there are two kinds of arbitrarily excited QFPs.

Figure 3:
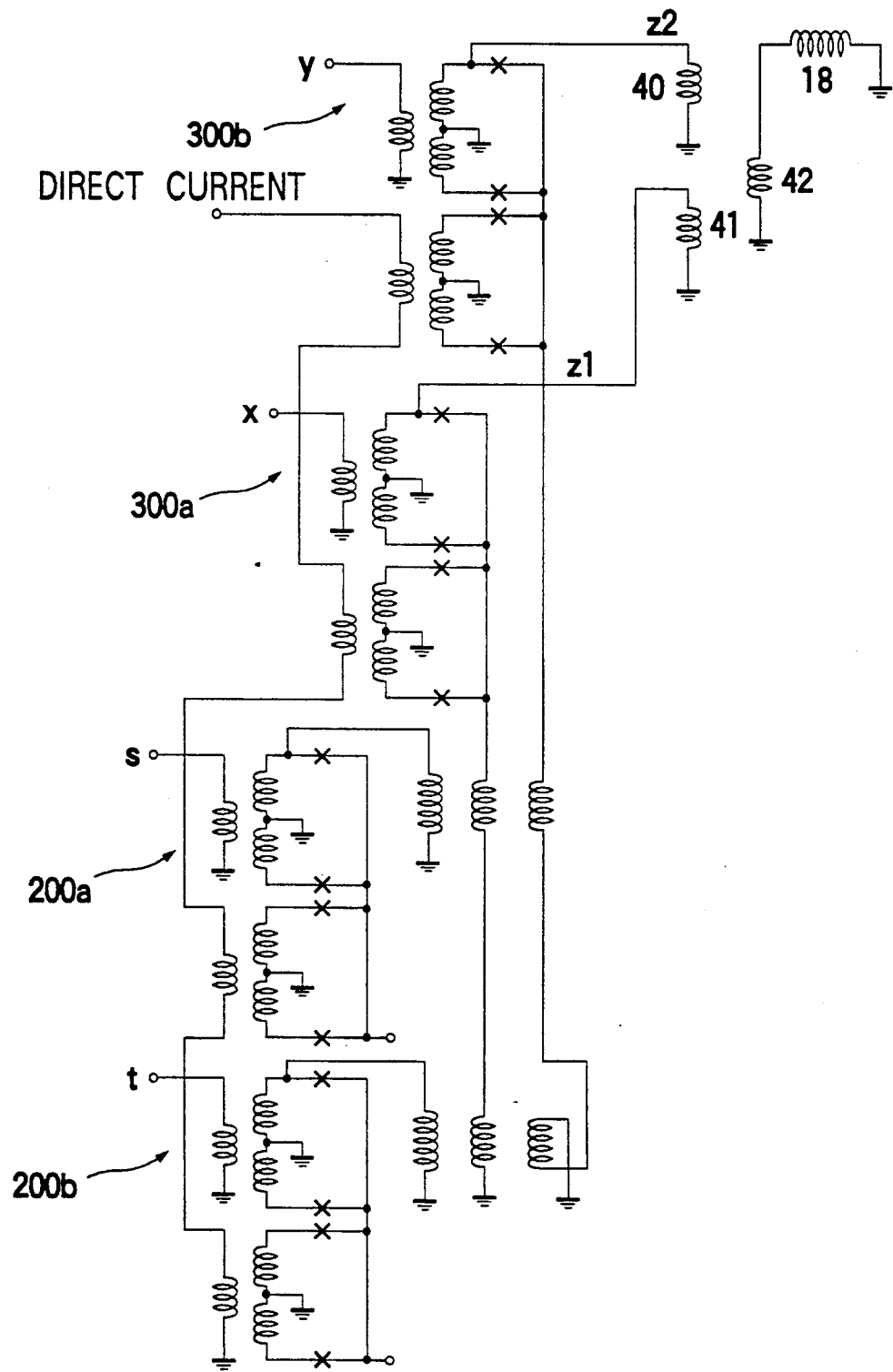
FIG. 3 shows an example of a basic logical operation circuit according to this invention.

The arbitrarily excited QFPs can not be individually used as a logic element because it produces no output when it is not excited. However, combination of the two kinds of arbitrarily excited QFPs can produce very convenient logic circuits. FIG. 3 shows a basic logic circuit using the input-output type QFPs according to this invention. This circuit comprises two arbitrarily excited QFPs and two periodically excited QFPs. The periodically excited QFPs 200a and 200b amplify the input signals s and t and the amplified signals are supplied to the arbitrarily excited QFP 300a and 300b as the exciting signals. The directions of the magnetic couplings between the exciting input lines and the exciting input inductors are determined so that one of the arbitrarily excited QFP is excited by a sum of the exciting input signals and the other of the arbitrarily excited QFP is excited by a difference of the exciting input signals. The output of the arbitrarily excited QFP 300a obeys a logic function z1=x s t+x s' t' and the output of the arbitrarily excited QFP 300b obeys a logic fuction z2=y s t+y s t', so only one of two arbitrarily excited QFPs can be excited at a time. The outputs of two arbitrarily excited QFPs are magnetically coupled with line 42 through output inductors 40 and 41 to do OR logic operation of z1 and z2. The above described logic circuit is called D gate.

If input signals are greater than noises, the logic operation of the D gate is carried out in no relation to the absolute values of the input signals. Thus, the D gate's stability against variations of the input signals is superior to the prior art QFP. As a result, scale of integration of circuits using D gates can be increased.

The outputs of D gate are represented by a four variable function $D(x, y, s, t)$. AND and OR logic operations needed for logic circuit design can be attained by suitably setting the input signals as indicated below:

$$AND(x, y) = D(x, "0", x, y)$$

$$OR(x, y) = D(x, "1", x, y)$$

Further, the three input majority operation and three input parity operation needed for the arithmetic operations can be carried out by one D gate as indicated below:

$$M(x, y, z) = D(x,y,x,z)$$

$$P(x, y, z) = D(x,x',y,z)$$

From the above descriptions, it can be found that D gate is a very powerful logic circuit.

This invention provides a new type QFP which can be excited by a very small exciting signal as compared with the prior art QFP and also provides QFP logic circuits with good stability against variations of the input signals, the exciting signals, the manufacturing conditions and so on. Therefore, it is possible to highly increase scale of integration of the circuits. And further, it becomes easy to design the circuits due to the powerful logical circuit called D gate.

While there have been described what are considered to be the preferred embodiments of this invention, it will be obvious to those skilled in the art that various changes and modifications may be made without departing from the spirit and scope of the invention.

What is claimed:

1. A superconducting circuit comprising:
   at least a periodically excited quantum flux parametron which is excited by periodically varying magnetic flux and used to amplify binary magnetic flux; and at least an arbitrarily excited quantum flux parametron which is excited by the output magnetic flux of one or more periodically excited quantum flux parametrons and used for logic operation of binary magnetic flux signals, said periodically excited quantum flux parametron and said arbitrarily excited quantum flux parametron, each comprising;
     a first superconducting loop having a pair of circuits which respectively comprise a first Josephson junction and a first input inductor, and a second Josephson Junction, and a second input inductor;
     an exciting line connected to the first superconducting loop;
     an input line magnetically connected to said first and second input inductors;
     a second superconducting loop having a pair of circuits which respectively comprise a third Josephson junction and a third input inductor, and a fourth Josephson junction and a fourth input inductor;
     an exciting line connected to said second superconducting loop;
     a direct current exciting input line magnetically connected to the third and the fourth input inductors; and
     an output inductor connected to the first superconducting loop, wherein the exciting lines of the first and second superconducting loops are directly connected, and the output inductors of the periodically excited quantum flux parametron is magnetically connected to the exciting line of the arbitrarily excited quantum flux parametron.

2. The superconductor circuit as claimed in claim 1, wherein the exciting line of the arbitrarily excited quantum flux parametron is magnetically connected to the output inductors of the periodically exciting quantum flux parametron, whereby the arbitrarily excited quantum flux parametron is excited by one of a sum and a difference of the magnetic flux output signals of the periodically excited quantum flux parametrons.

3. The superconducting circuit as claimed in claim 1, wherein two of said periodically quantum flux parametrons and two of the arbitrarily excited quantum flux parametrons are provided, the exciting line of one of the arbitrarily excited quantum flux parametrons is magnetically connected to the output inductors of the periodically excited quantum flux parametrons such that the one of the arbitrarily excited quantum flux parametron is excited by a sum of the magnetic flux output signals of the periodically excited quantum flux parametron, the exciting line of an other of the arbitrarily excited quantum flux parametrons is magnetically connected to the output inductors of the periodically excited quantum flux parametrons so that the other of the arbitrarily excited quantum flux parametron is excited by a difference of the magnetic flux output signals of the quantum flux parametrons, the output inductors of the arbitrarily excited quantum flux parametrons are magnetically coupled with a line for performing OR logic operation of output signals of the arbitrarily excited quantum flux parametrons.

4. A superconducting circuit comprising:
   a first superconducting loop having a pair of circuits respectively comprising:
     a first Josephson junction and a first input inductor, and a second Josephson junction and a second input inductor;
     an exciting line connected to said first superconducting loop;
   an output inductor connected to said first superconducting loop;
     an input line magnetically connected to said first and second inductors;
   a second superconducting loop having a pair of circuits which respectively comprises a third Josephson junction and a third input inductors, and a fourth Josephson junction and a fourth inductor;
   an exciting line connected to said second superconducting loop; and
   a direct current exciting input line magnetically connected to the third and the fourth input inductors, wherein the exciting lines of the first and second superconducting loops are directly connected.

* * * * *